METHOD OF FABRICATING A SEMICONDUCTOR DEVICE

Filed Nov. 27, 1961 2 Sheets-Sheet 1

INVENTORS: R. EDWARDS
J. E. IWERSEN
H. H. LOAR
I. M. ROSS

BY H W Lockhart
ATTORNEY

INVENTORS: R. EDWARDS
J. E. IWERSEN
H. H. LOAR
I. M. ROSS

BY [signature]
ATTORNEY 3,189,973
Patented June 22, 1965

3,189,973
METHOD OF FABRICATING A SEMICONDUCTOR DEVICE

Roger Edwards, Gillette, John E. Iwersen, Morristown, Howard H. Loar, Madison, and Ian M. Ross, Summit, N.J., assignors to Bell Telephone Laboratories, Incorporated, New York, N.Y., a corporation of New York Filed Nov. 27, 1961, Ser. No. 154,958
1 Claim. (Cl. 29—25.3)

This invention relates to methods for semi-conductor fabrication. More particularly, the invention involves unique silicon semiconductor device configurations attained by methods which combine in novel fashion the steps of oxide masking, semiconductor film growth, impurity diffusion and metal deposition.

Therefore, a broad object of this invention is improved semiconductor devices.

Another object is more facile methods of fabricating semiconductor devices.

Yet another object is a method for producing devices hitherto practically unrealizable.

In one aspect the method of this invention involves the deposition of films of semiconductor material, portions of which grow as single crystal material and other portions of which grow in polycrystalline form.

In one specific embodiment of the method in accordance with this invention a silicon wafer of single crystal N-type conductivity has all of one major surface thereof covered by a coating of silicon oxide except for a particular exposed area, which advantageously is centrally located. Silicon semiconductor material of P-type conductivity then is deposited from the vapor state on to the oxide-masked major surface of the wafer. This deposited semiconductor layer generally is polycrystalline in structure in the portions deposited on the oxide coating, but is single crystal or epitaxial in the portion deposited on the exposed single crystal substrate.

Next, another oxide coating is formed over all of this deposited semiconductor layer except for a central part, less than the whole, of the single crystal portion. Typically by vapor diffusion, this central exposed part then is converted to N-type conductivity to a depth which is less than the thickness of the previously deposited P-type layer. The surface oxide coating then is removed. A metallic electrode in the form of a dot is applied to the surface of the diffused N-type ortion which now constitutes the emitter zone of a transistor and an annular metallic ring is applied to the large surface of the polycrystalline area so as to contact the P-type layer which serves as the base zone. Finally, an electrode on the back surface of the wafer similarly provides a low resistance contact to the N-type substrate, which constitutes the collector zone of the transistor.

Thus the method of this invention facilely produces PN junction devices in which the extent of the collector junction is determined by an oxide coating mask which becomes a part of the final structure. A characteristic of the process is that it makes possible a transistor having emitter and collector PN junctions of substantially the same area. This symmetrical transistor structure enables a lower saturation voltage ($V_{ce}$) which increases the circuit capabilities of the device.

Moreover, by inverting the foregoing described structure so that the original substrate forms the emitter region and by producing a plurality of distinct base regions and collector regions, an extremely useful common emitter device results. Such a common emitter arrangement enables a device of the integrated type which is particularly advantageous for logic switching applications. Useful common emitter structures, from a practical standpoint, have been virtually unrealizable heretofore insofar as applicants are aware.

A further feature which is inherent in the method of this invention is a technique wherein at least one PN junction is fabricated with the boundary completely covered and protected from the ambient atmosphere.

The invention and its other objects and features will be more clearly understood from the following description taken in connection with the drawing in which.

Figure 1:
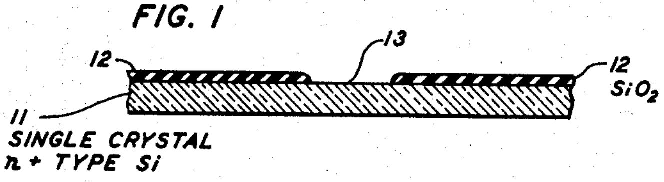
FIGS. 1, 2, 3 and 4 are schematic sections of a semiconductor wafer indicating successive fabrication steps in accordance with the method of this invention.

Referring to FIG. 1, the fabrication of a device in accordance with this invention begins with a single crystal wafer 11 of silicon of a particular conductivity type, in this specific embodiment, of highly doped N-type silicon. Generally, the process may be employed using a relatively large slice of material upon which is fabricated a multiplicity of individual devices. In the drawing only a portion of the slice is shown, sufficient to indicate the fabrication of a single device.

Upon one major face of the slice there is formed a coating 12 of silicon oxide ($SiO_2$) which is noncontinuous over the portion 13 wherein the single crystalline substrate is exposed. This configuration conveniently may be produced by using a thermal oxide film-forming technique or by vapor-depositing a silicon oxide. The exposed portion 13 then is produced advantageously by employing a photoresist technique such as is disclosed, for example, in U.S. Patent 3,122,817 granted March 3, 1964, to J. Andrus.

Figure 2:
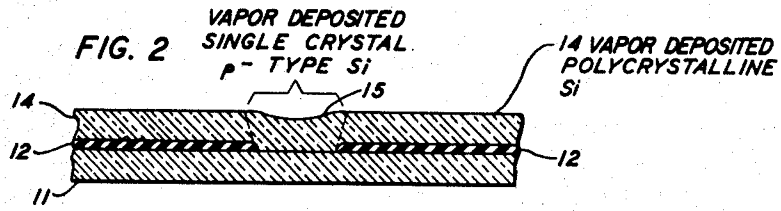
Figure 3:
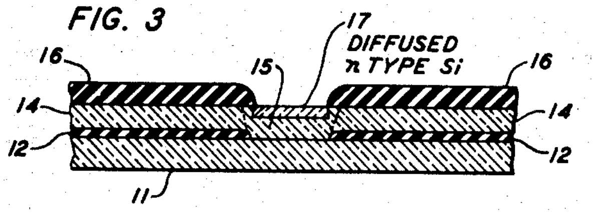

The partially masked silicon substrate then is subjected to a vapor deposition of P-type conductivity silicon to produce the arrangement shown in FIG. 2. One advantageous vapor deposition technique is disclosed in United States Patent 3,165,811 granted January 19, 1965 to J. J. Kleimack, H. H. Loar and H. C. Theuerer. As suggested therein boron tribromide may be used as a P-type impurity as well as other standard P-type diffusants. Typically, the central portion 15 of the deposited material which is based on the single crystal substrate likewise is monocrystalline. The peripheral portion 14 of the film which is deposited on the oxide layer typically forms as polycrystalline. In one typical embodiment this deposited film is .08 mil thick. To this point the method of this invention has produced a semiconductor element which requires only the addition of metallic electrodes on the opposite faces thereof, and attachment of leads thereto to form a diode. Such a diode has the advantage that the boundaries of the PN junction do not intersect a surface and are thus more stable than diode configurations in which a PN junction boundary is exposed. In particular, satisfactory electrical contact may be made to the deposited P-type zone by applying metallic electrodes to any portion of the upper surface of the wafer including the polycrystalline portion.

Figure 4:
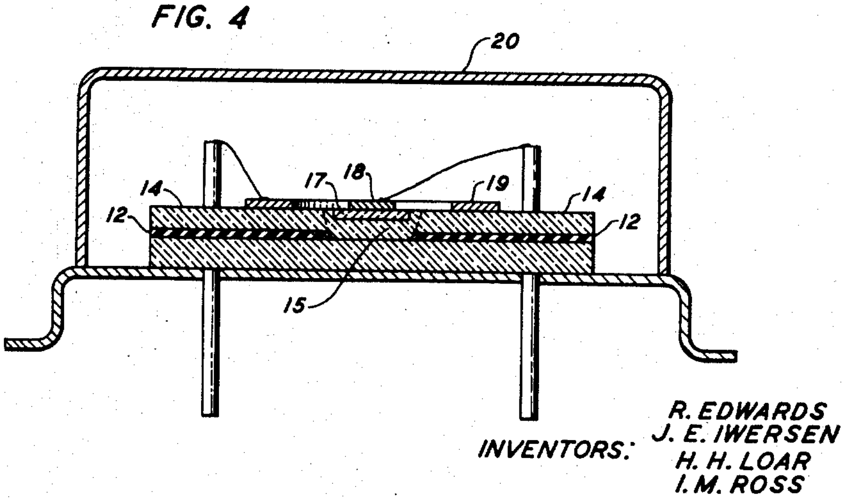
Figure 5:
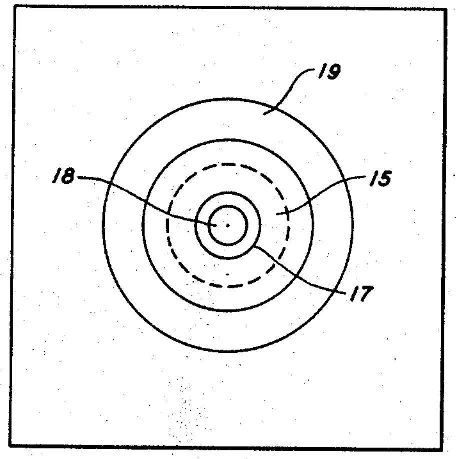
FIG. 5 is a plan view of the transistor shown in section in FIG. 4.

Further, in accordance with this invention, the fabrication may be continued to produce a three-region semiconductor device suitable for use as a transistor by providing another coating 16 of silicon oxide on top of the previously deposited films and layers. Again, a portion of the oxide coating is removed to expose the underlying silicon substrate. This exposed area is less than the area of the surface of the single cyrstal central portion. The semiconductor element then is subjected to a vapor diffusion of an N-type impurity, typically phosphorus, which alters the conductivity type of the portion 17 of the single crystal material underlying the exposed central area. Typically, the N-type region 17 has a depth of .04 mils. Then the element is treated in hydrofluoric acid to remove the surface oxide coating 16 and a central metallic electrode 18 is applied to the surface of the N-type region 17 and a ring electrode 19 is applied to the polycrystalline layer 14. Advantageously, the oxide layer may be removed only partially by photoresist techniques to permit making the base electrode 19. In such case the oxide layer provides a protective coating over a portion of the device surface. Thus, the electrode 18 constitutes the emitter connection and the electrode 19 the base connection. An additional metallic layer may be plated on the bottom surface of the wafer to provide an electrode to the collector zone 11 which comprises the original silicon substrate. The ring and dot form of the electrode is illustrated in the view shown in FIG. 5 of the top surface of the completed device. As shown schematically in FIG. 4, the semiconductor may be mounted and encapsulated in an envelope 20.

A consideration of the illustrations indicates the advantages of this particular structure and the method for its fabrication. In particular, the area of the collector junction is determined by the extent of the original oxide mask 12 and the exposed area 13. This area is comparable to the area of the diffuesd portion 17 which likewise is determined by an oxide mask. At the same time, the method enables the use of solid state diffusion to accurately determine the thickness of the base region which advantageously is small for higher frequency operation. Furthermore, the attachment of electrodes particularly to the base region is simplified in that a relatively large portion of a major surface of the wafer is available for the application of the ring electrode 19.

Although the foregoing described structures contemplate separation of the plurality of elements into separate transistors, as has been referred to hereinbefore, the undivided structure may be utilized as a common emitter device using the substrate region 11 as the emitter and attaching a plurality of leads to the several base and collector regions. Such a device has particualr advantages for switching applications because of junction symmetry.

Figure 6:
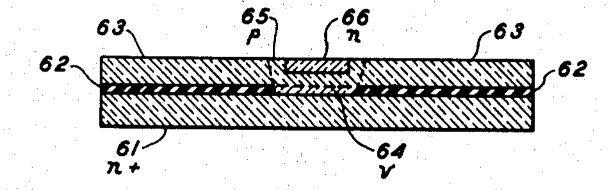
FIG. 6 is a sectional view of a transistor fabricated in accordance with this invention, having an additional high resistivity region.

Further variations on this particular method of this invention may be used to produce more complex devices having particular applications. Referring to FIG. 6, there is shown a transistor fabricated generally in accordance with the method described above with the additional step that the initially deposited semiconductor material is high resistivity N-type material ($\nu$). This provides a structure having particularly advantageous characteristics for high speed switching as well as amplification in the high frequency ranges.

Figure 7:
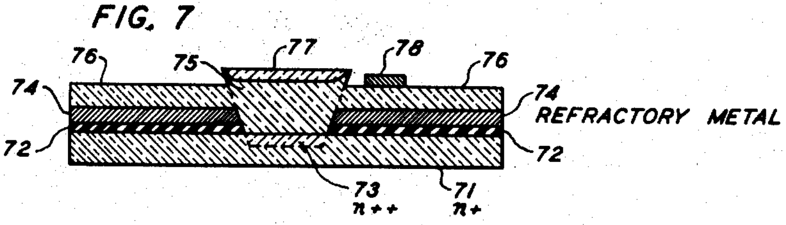
FIGS. 7 and 8 are sectional views of other semiconductor devices fabricated in accordance with the method of this invention.

Moreover, the invention lends itself particularly to the fabrication of multilayer devices in which the attachment of electrodes may be facilely made. FIG. 7 illustrates another variation in the fabrication of a transistor structure which begins a silicon substrate 71 of low resistivity material ($n+$). An oxide layer 72 is formed on one surface of this substrate and a layer 74 of a metal having a relatively high melting temperature (refractory metal), typically tantalum or molybdenum, then is sputtered on top of the oxide layer. In this context a refractory or high melting point metal means a metal having a melting point well above 1400 degrees centigrade which is generally about the highest temperature used for heat treatment of the assembly subsequent to the metal deposition step. A photoresist mask next is formed on the surface of the metal layer 74 covering all but a central portion. By chemical etching, the unmasked portion of the metal layer and the underlying oxide layer are removed to expose a part of the single crystal substrate.

A layer of silicon material of P-type conductivity then is grown by vapor deposition on this face of the wafer, the central portion 75 forming as a single crystal structure while the peripheral portion 76 forms as polycrystalline material. The film is grown to sufficient depth to permit subsequent diffusion of an N-type impurity such as phosphorus into the surface portion 77 to provide an emitter zone. A metal electrode 78 provides low resistance contact to the intermediate P-type region 75 through the layer of vapor-deposited polycrystalline silicon 76.

The inclusion of the refractory metal layer 74 in addition to providing a convenient arrangement for attaching a lead to an intermediate conductivity type region enables in this specific embodiment, improved lateral conductivity for the base contact as well as protection for the underlying oxide layer.

An alternative technique for achieving this structure involves deposition of a first oxide layer on the substrate material followed by deposition of the metal layer and finally by formation of an overlying oxide layer. A "window" through all three layers is then produced by provision of a photoresist mask and a series of chemical etches so as to expose a portion of the surface of the substrate 71. Next, the $n++$ portion 73 is produced by diffusion and the central epitaxial portion is produced by deposition as previously described and followed by final diffusion of the N-type region 77. This alternative technique offers advantages from the standpoint of registration inasmuch as the same "window" is employed for both diffusion and epitaxial growth.

Figure 8:
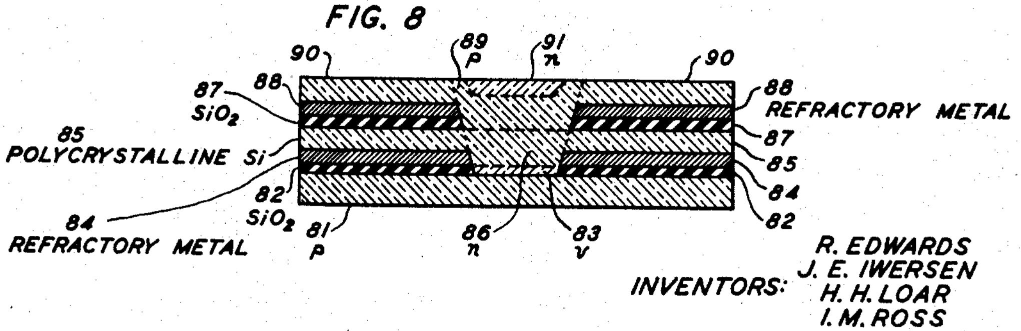

In the device of FIG. 8, a four-layer structure is produced having a high resistivity barrier layer between two of the regions and provision for making the electrical contact to all of the conductivity type zones if desired. The buildup of the structure is similar to that described above in connection with FIG. 7 with interposed layers of refractory metals for making contact to the intermediate conductivity type regions. Lead attachment to these layers 84 and 88 may be facilitated by removing peripheral portions of the wafer structure by etching or ultrasonic cutting, for example, so as to expose peripheral surface areas of the metal layers.

It will be understood that the above-described specific embodiments are but illustrative and that other arrangements and configurations may be devised by those skilled in the art without departing from the scope and spirit of the invention. In particular, the process described can be utilized over only a limited portion of a larger semiconductive body, as for example in the fabrication of an integrated circuit device. For the purposes of the claim, a "wafer" can be a discrete portion of a larger semiconductive body.

What is claimed is:

In the process of fabricating a semiconductor signal translating device the steps of masking the surface of a body of signal crystal silicon of one conductivity type except for a limited area thereof by coating a portion of said surface with a film of silicon oxide, vapor depositing on said masked surface a layer of said semiconductor material of opposite conductivity type, said layer having a single crystal portion where deposited substantially over said limited area of unmasked surface and a polycrystalline portion where deposited over said oxide, said single crystal portion of said deposited layer defining a PN junction with said silicon body over said limited area, forming a second PN junction at the surface of said single crystal portion of said layer by providing thereat another region of said one conductivity type, making low resistance electrical connection to each of said conductivity type regions including applying a low resistance electrode to the surface of said polycrystalline deposited layer.

References Cited by the Examiner

UNITED STATES PATENTS

| | | | |
|---|---|---|---|
| 2,858,489 | 10/58 | Henkels | 29—25 |
| 2,981,877 | 4/61 | Noyce | 29—25.3 X |
| 3,025,589 | 3/62 | Hoerni | 29—25.3 |
| 3,047,438 | 7/62 | Marinace | 148—175 |
| 3,089,794 | 5/63 | Marinace | 148—188 X |

OTHER REFERENCES

Theuerer et al.: "Proceeding's of the IRE," September 1940, pages 1642–43 (received July 5 1960) TK 570017.

Marinace: IBM Technical Disclosure Bulletin, vol. 3, No. 4, September 1960, page 42, TK 7800 113.

Maissel and Schwartz :IBM Technical Disclosure Bulletin, vol. 3, No. 12, May 1961, pages 30–31, TK 780 I 13.

RICHARD H. EANES, JR., *Primary Examiner.*

LEON PEAR, *Examiner.*